US011869744B2

(12) United States Patent
Walden, II et al.

(10) Patent No.: US 11,869,744 B2
(45) Date of Patent: *Jan. 9, 2024

(54) ELECTRON MICROSCOPE SAMPLE HOLDER FLUID HANDLING WITH INDEPENDENT PRESSURE AND FLOW CONTROL

(71) Applicant: Protochips, Inc., Morrisville, NC (US)

(72) Inventors: Franklin Stampley Walden, II, Raleigh, NC (US); John Damiano, Jr., Holly Springs, NC (US); Daniel Stephen Gardiner, Wake Forest, NC (US); William Bradford Carpenter, Asheville, NC (US)

(73) Assignee: Protochips, Inc., Morrisville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/570,481

(22) Filed: Jan. 7, 2022

(65) Prior Publication Data
US 2022/0130637 A1 Apr. 28, 2022

Related U.S. Application Data

(63) Continuation of application No. 16/734,548, filed on Jan. 6, 2020, now Pat. No. 11,222,765, which is a (Continued)

(51) Int. Cl.
*H01J 37/20* (2006.01)
*G01F 1/34* (2006.01)
*G05D 7/06* (2006.01)

(52) U.S. Cl.
CPC ............... *H01J 37/20* (2013.01); *G01F 1/34* (2013.01); *G05D 7/0635* (2013.01); *H01J 2237/006* (2013.01); *H01J 2237/26* (2013.01)

(58) Field of Classification Search
CPC ................ H01J 37/20; H01J 2237/006; H01J 2237/2003; G01F 1/34
See application file for complete search history.

(56) References Cited

U.S. PATENT DOCUMENTS

| 5,367,171 A | 11/1994 | Aoyama et al. |
| 2012/0298883 A1 | 11/2012 | Grogan et al. |

(Continued)

FOREIGN PATENT DOCUMENTS

| JP | 2011175809 A | 8/2011 |
| JP | 2014026840 A | 6/2014 |
| WO | 2016047829 A1 | 3/2016 |

OTHER PUBLICATIONS

ISA/KR; International Search Report and Written Opinion for International Patent Application No. PCT/US2018/041048 dated Nov. 27, 2018, 10 pages.

(Continued)

*Primary Examiner* — Eliza W Osenbaugh-Stewart
(74) *Attorney, Agent, or Firm* — NK Patent Law

(57) ABSTRACT

A fluid metering system for gas independent pressure and flow control through an electron microscope sample holder includes: a pressure control system that supplies gas; an inlet line providing gas from the pressure control system to the sample holder; an outlet line receiving gas from the sample holder; and a variable leak valve that controls gas flow in the outlet line. The gas flows from an upstream tank of the pressure control system through the sample holder and variable leak valve to a downstream tank of the pressure control system due to the pressure difference of the two tanks as the variable leak valve meters flow in the outlet line. Flow rates are established by monitoring pressure changes at source and collection tanks of known volumes with gas (Continued)

independent pressure gauges. A method of directing the gas flow to a residual gas analyzer (RGA) is also presented.

12 Claims, 8 Drawing Sheets

Related U.S. Application Data continuation of application No. PCT/US2018/041048, filed on Jul. 6, 2018.

(60) Provisional application No. 62/529,195, filed on Jul. 6, 2017.

(56) References Cited

U.S. PATENT DOCUMENTS

| | | |
|---|---|---|
| 2012/0305769 A1 | 12/2012 | Yagauchi et al. |
| 2015/0137001 A1* | 5/2015 | Hiroki ............... H01J 37/18 250/441.11 |
| 2015/0179396 A1* | 6/2015 | Yaguchi ............... H01J 37/26 250/440.11 |
| 2016/0033355 A1 | 2/2016 | Gardiner et al. |
| 2016/0211109 A1* | 7/2016 | Nagakubo ............. H01J 37/285 |

OTHER PUBLICATIONS

WIPO; International Preliminary Report on Patentability for International Patent Application No. PCT/US2018/041048 dated Jan. 16, 2020, 7 pages.

EPO, Extended European Search Report for corresponding European Patent Application No. 18827985.5, dated Mar. 5, 2021, 7 pages.

M. Cem Akatay et al.: "Gas mixing system for imaging of nanomaterials under dynamic environments by environmental transmission electron microscopy", Rev. Sci. Instrum. 85, 033704 (2014), https://doi.org/10.1063/1.4867903, 6 pages.

USPTO; Non-Final Action for U.S. Appl. No. 16/734,548 dated Mar. 24, 2021, 24 pages.

JPO; Office Action from Corresponding JP Patent Application No. 2020-500071, dated Aug. 16, 2022, 8 pages.

* cited by examiner

ELECTRON MICROSCOPE SAMPLE HOLDER FLUID HANDLING WITH INDEPENDENT PRESSURE AND FLOW CONTROL

CROSS-REFERENCE TO RELATED APPLICATION

This application is a continuation of U.S. non-provisional patent application Ser. No. 16/734,548, titled "ELECTRON MICROSCOPE SAMPLE HOLDER FLUID HANDLING WITH INDEPENDENT PRESSURE AND FLOW CONTROL," filed on Jan. 6, 2020, which is a continuation of International Patent Application No. PCT/US18/41048, titled "ELECTRON MICROSCOPE SAMPLE HOLDER FLUID HANDLING WITH INDEPENDENT PRESSURE AND FLOW CONTROL," filed on Jul. 6, 2018, which claims the benefit of priority of U.S. provisional patent application No. 62/529,195, titled "Electron Microscope Sample Holder Fluid Handling with Independent Pressure and Flow Control," filed on Jul. 6, 2017, the entire contents of which are all hereby incorporated herein by reference.

TECHNICAL FIELD

The present disclosure relates to providing gas flow. More particularly, the present disclosure relates to providing gas and controlling pressure and flow to a sample holder for an electron microscope.

BACKGROUND

In prior art systems, fluid flows through an electron microscope sample holder to control or maintain reaction activity during imaging. In a typical closed-cell fluid system, gas comes from an inlet line and into an imaging area enclosed by hermetically sealed windows and exits the TEM holder through an outlet line enabling the TEM column to remain at ultra-high vacuum or high vacuum.

Some prior art systems adjust and measure flow rates through the system. It is common in systems like this to produce flow rates by one or more mass flow controllers (MFCs). A MFC is a device used to measure and control the flow of gases. A mass flow controller is designed and calibrated to control a specific type of gas at a particular range of flow rates. Because of this dependency on the gas species, multiple MFCs with different calibrations are required to control the flow rates of a wide range of pure gases to the sample holder. Users are typically studying gas reactions of nanoparticles and the desired flow rates through the electron microscope sample holder are as low as 0.005 SCCM or lower. A typical MFC cannot reach these flow rates alone, and would require adding additional components and complexity to the system. For example, to achieve lower flow rates, the system could divert a portion of the gas flow from the MFC(s) to the sample holder and exhaust the remaining gas, requiring a switching valve and at least one additional gas flow sensor to measure the reduced flow rate. Also, in a system like this, achievable flow rates are dependent on the pressure of the system. For example, a low pressure in the system will limit the maximum flow rate and a high pressure in the system will limit the minimal flow rate. Also, since MFCs are calibrated to a specific gas species, a complex mixture of gases or an unknown mixture of gas cannot be metered accurately; an example of such a mixture would be vehicle exhaust.

Considering the disadvantages of the prior art, a novel approach to a system that controls flow rates of various gases through an electron microscope holder is needed, wherein said system can achieve a full range of flow rates independent of pressure, and is also independent of the species of gases entering the system.

SUMMARY

This summary is provided to introduce in a simplified form concepts that are further described in the following detailed descriptions. This summary is not intended to identify key features or essential features of the claimed subject matter, nor is it to be construed as limiting the scope of the claimed subject matter.

This invention utilizes sensitive gas independent pressure gauges connected to a tank or tanks of known volume(s), and adjusts flow rates with a variable leak valve. A wide range of flow rates, including very low flow rates, can be attained and metered accurately, independent of the gas or the gas mixture composition. Accurate gas mixtures can also be achieved.

According to at least one embodiment, a system for controlling fluid flow through an electron microscope sample holder includes: a pressure controlled gas supply; an inlet line for providing the gas from gas supply to the sample holder; an outlet line for receiving the gas from the sample holder; and a variable leak valve that controls the gas flow in the outlet line. A variable leak valve, also referred to as a gas regulating valve, changes the flow rate of a gas by increasing or decreasing an orifice in the flow path providing a range of flow rates. An example of a variable leak valve is model EVR 116 "Gas Regulating Valve" produced and sold by Pfeiffer Vacuum SAS (Annecy, France). This valve provides a gas flow range from $5*10^{-6}$ hPa·l/s to $1.25*10^{3}$ hPa·l/s.

In at least one example, a boom supports the variable leak valve in proximity to the sample holder. Herein, a boom is a mechanical support optionally extended from the pressure control system used to position the variable leak valve in close proximity to the sample holder. Locating the variable leak valve in close proximity to the sample holder is preferable because reducing volume between the variable leak valve's flow constriction and the natural constriction that occurs in the sample holder's tip due to the thin fluid gaps that are ideal for closed cell imaging allows for faster pump/purges of fluid lines and faster transition from oxidizing to reducing gases during experimentation. Reducing volume between the two flow restrictors minimizes the time required to pump the gases through the restrictors. This enables faster transitions to new experimental gases and prevents trapped gases from backflowing into the sample area.

In at least one example, the gas flows from an upstream tank or fluid source of the pressure control system through the sample holder and variable leak valve to a downstream tank of the pressure control system due to the pressure difference of the two tanks as the variable leak valve meters gas flow in the outlet line. The variable leak valve is on the outlet line so that the gas source can dictate the experimental pressure at the imaging area in the electron microscope. The largest pressure drop is created by the leak valve. In other words, the pressure at the sample area of the sample holder is close to the same pressure as the source gas. The upstream fluid source can be a tank, tube or any gas container or source. It could even be an open tube exposed to the air if pulling air through the sample holder is wanted.

In at least one example, there is a gate valve between the variable leak valve and the sample holder. This gate valve can be near or attached to the sample holder.

In at least one example, an inline residual gas analyzer (RGA) is between the variable leak valve and pressure control system. A residual gas analyzer (RGA) is a spectrometer that effectively measures the chemical composition of a gas present in a low-pressure environment.

In at least one example, the variable leak valve is mounted directly to the residual gas analyzer (RGA).

In at least one example, the system includes a switching valve downstream of the variable leak valve wherein the valve selectively directs outlet gas from the outlet line to the pressure control system or Residual Gas Analyzer (RGA). This switching valve can be manually operated or automatic.

In at least one example, the system includes a residual gas analyzer (RGA), wherein the outlet line is connected to a variable leak valve prior to connection to an RGA.

In at least one example, gases are added in series to a mixture tank to create precise, verifiable, mixture ratios.

In at least one example, gas mixtures of various complexities are enabled by the system without impacting the ability to meter flow rate accurately.

BRIEF DESCRIPTION OF THE DRAWINGS

The previous summary and the following detailed descriptions are to be read in view of the drawings, which illustrate particular exemplary embodiments and features as briefly described below. The summary and detailed descriptions, however, are not limited to only those embodiments and features explicitly illustrated.

DETAILED DESCRIPTIONS

Figure 1:
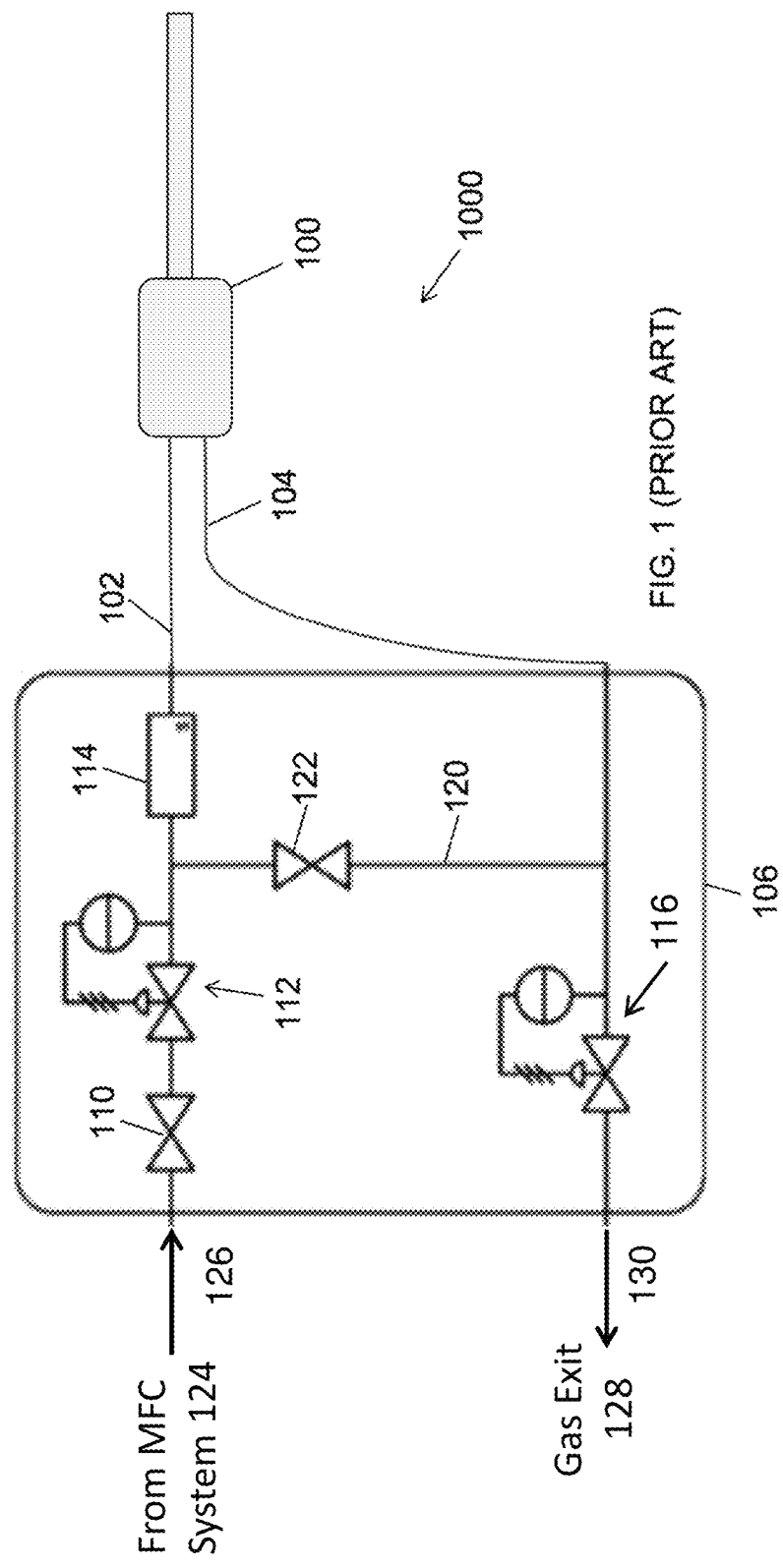
FIG. 1 is a diagrammatic representation of a system according to the prior art for controlling fluid flow through an electron microscope sample holder.

These descriptions are presented with sufficient details to provide an understanding of one or more particular embodiments of broader inventive subject matters. These descriptions expound upon and exemplify particular features of those particular embodiments without limiting the inventive subject matters to the explicitly described embodiments and features. Considerations in view of these descriptions will likely give rise to additional and similar embodiments and features without departing from the scope of the inventive subject matters. Although the term "step" may be expressly used or implied relating to features of processes or methods, no implication is made of any particular order or sequence among such expressed or implied steps unless an order or sequence is explicitly stated.

Any dimensions expressed or implied in the drawings and these descriptions are provided for exemplary purposes. Thus, not all embodiments within the scope of the drawings and these descriptions are made according to such exemplary dimensions. The drawings are not made necessarily to scale. Thus, not all embodiments within the scope of the drawings and these descriptions are made according to the apparent scale of the drawings regarding relative dimensions in the drawings. However, for each drawing, at least one embodiment is made according to the apparent relative scale of the drawing.

FIG. 1 is a diagrammatic representation of a system 1000 according to the prior art for controlling fluid flow through an electron microscope sample holder 100. A gas or a mixture of gases enters the flow control system 106 from inlet line 126. The pressure and flow control system 106 receives gas in route to the inlet line 102 through a valve 110 and pressure regulator 112 upstream of a mass flow sensor 114, which is used to measure the flow of the gas. The pressure and flow control system 106 supplies gas to the inlet line 102 and to a sample holder 100 and receives gas returning from the sample holder 100 via the outlet line 104.

The gas returning to the flow control system 106 through the outlet line 104 passes through a second pressure regulator 116 in route to exiting the flow control system 106 via exit line 130 to the gas exit 128. A bypass line 120 and inline valve 122 are used for diverting some of the gas directly from the first pressure regulator 112 to the second regulator 116 reducing the gas flow rate through the sample holder 100. Pressure in the sample holder 100 is controlled by the upstream first pressure regulator 112 and downstream second pressure regulator 116. Flow volume rate is measured by the mass flow sensor 114.

Figure 2:
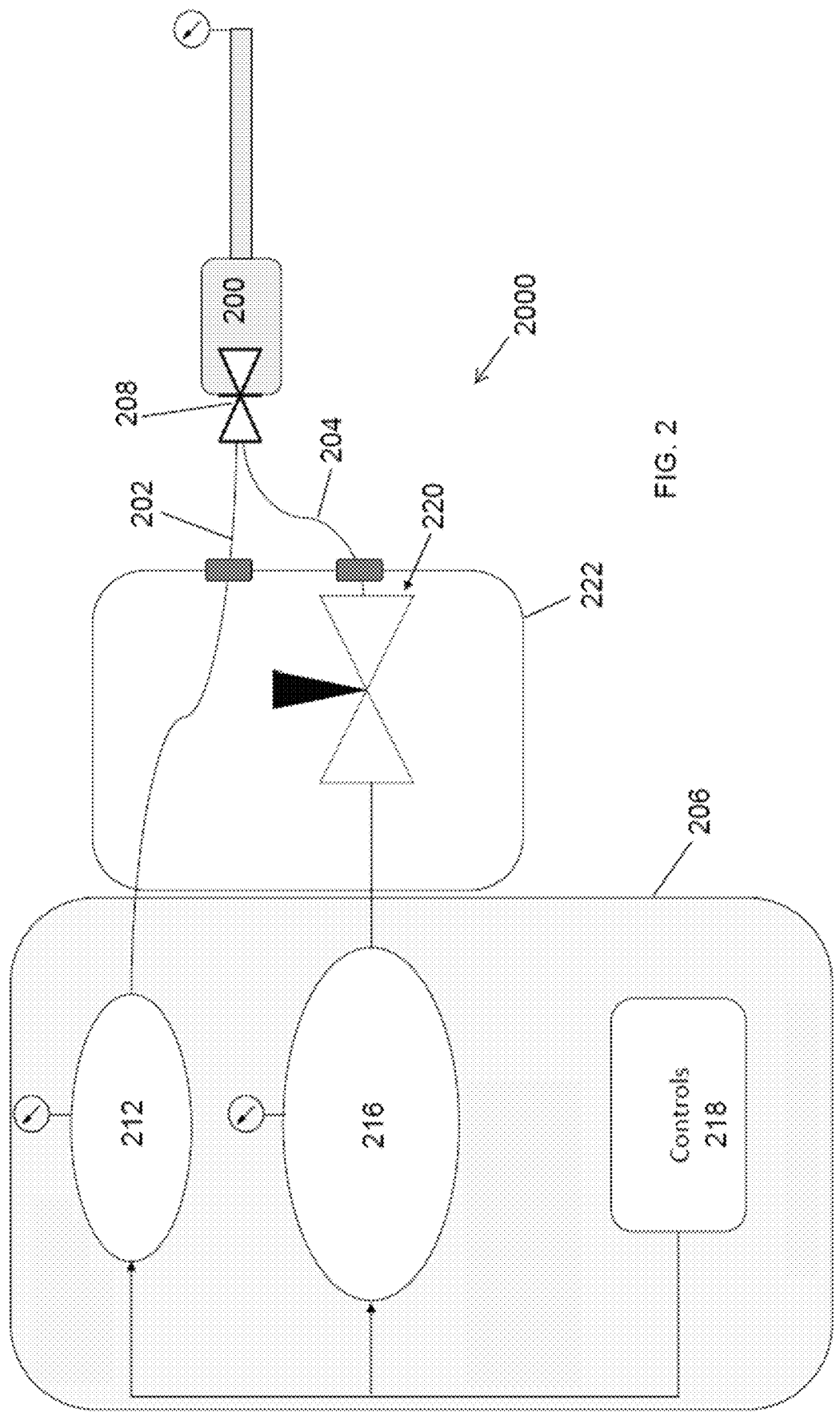
FIG. 2 is a diagrammatic representation of an improved system, according to at least one embodiment, for controlling fluid flow through an electron microscope sample holder.

FIG. 2 is a diagrammatic representation of an improved system 2000, according to at least one embodiment, for controlling fluid flow through an electron microscope sample holder 200. A flow of gas to the sample holder 200 is provided through an inlet line 202 and an outlet line 204. A pressure control system 206 supplies gas to the inlet line 202 and receives gas returning from the sample holder 200 via the outlet line 204. The pressure control system 206 provides gas to the inlet line 202 from an upstream tank 212 and receives outgoing gas from the outlet line 204 into a downstream tank 216, which is maintained at a lower pressure than the upstream tank 212. Gas flows from the upstream tank 212 through the sample holder 200 to downstream tank 216 due to the pressure difference of the two tanks. Flow rates are calculated easily via software or firmware controller 218 by the calculating the rate of pressure changes (e.g. Torr L/sec) in the upstream tank 212 and/or the downstream tank 216 with the time recorded pressure measurements of the gas independent pressure gauges, such as the Baratron® 722B series compact absolute capacitance manometer, located at the tanks.

An electronically controlled variable leak valve 220 meters gas flow in the outlet line 204. A boom 222 diagrammatically represented in FIG. 1 supports the inlet and outlet lines and valve 220 in relative close proximity to the sample holder 200, which is mounted in an electron microscope in use.

The variable leak valve 220 need not be electronically controlled, it could be manual. Electronically driven variable leak valves are advantageous in that they can be integrated into software workflows. The boom is also optional. It is advantageous to limit volume between the sample and the leak valve. An accessory that hangs from the TEM or further away from the TEM and connected by thin capillary tubing with low volume fittings could also be used. Thin capillaries limit (i.e. reduce) pump speed.

The sample holder 200 has a gate valve 208 that opens and closes both the inlet and outlet to the sample holder 200 simultaneously, which is advantageously easier and safer. The holder gate valve 208 is optional. It gives users the ability to close off the holder completely for 2 main purposes: (1) Sample prep transfer—Users can prep samples away from the manifold in a glove box and then move it to hook it up to the manifold without exposing the inside to air. Herein a glove box is a closed chamber into which a pair of gloves projects from openings in the side, where the inside of the chamber is filled with a preferred gas or gas mixture. This is advantageous for air-sensitive samples. (2) When the user changes experiment gases (usually going from reducing gas to oxidizing gas) they must pump and sometimes purge (flow inert gas through lines) all the gas capillaries so that there are a negligible amount experimental gas molecules in the system that will mix with the new gas. This is typically preferable over pumping on the sample holder 200 directly or flow an inert gas through the sample holder 200. Closing gate valve 208 on the sample holder 200 allows users to run pump/purges on the rest of the system without affecting what is happening at the sample in the sample holder 200. After the pump and purges are complete, gas from experiment tank 212 is introduced upstream of the gate valve 208 and the gate valve 208 is opened to supply the gas to the sample holder.

Figure 3:
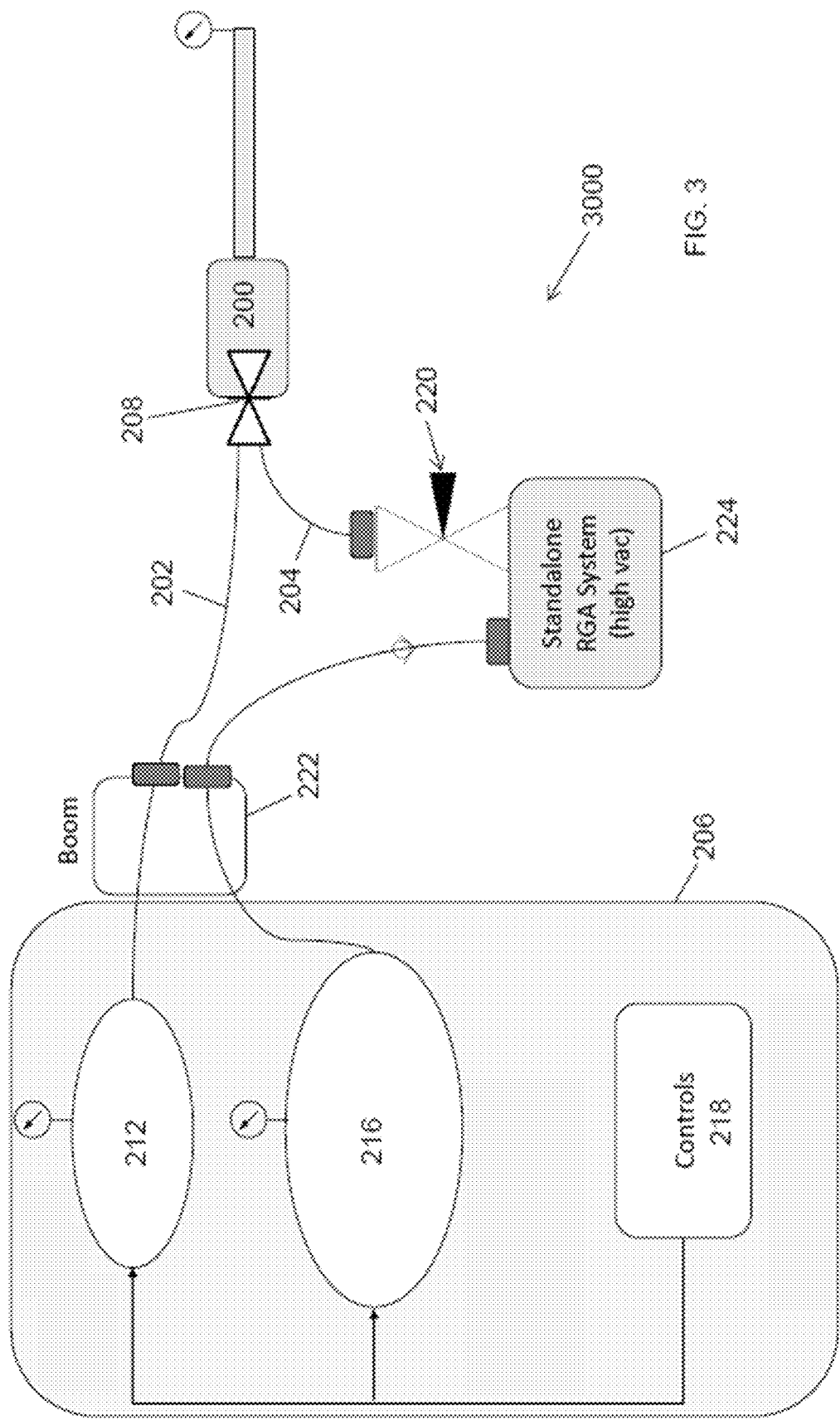
FIG. 3 is a diagrammatic representation of an improved system with inline residual gas analyzer (RGA) integration, according to at least one other embodiment, for controlling fluid flow and analyzing fluid compositions through an electron microscope sample holder.

FIG. 3 is a diagrammatic representation of an improved system 3000 with inline residual gas analyzer (RGA) integration, according to at least one other embodiment, for controlling fluid flow through the electron microscope sample holder 200. In FIG. 3, an RGA 224 is used between the variable leak valve 220 and pressure control system 206. In the illustrated system of FIG. 3, the variable leak valve 220 is mounted directly to the RGA 224. The RGA 224 is positioned downstream of the leak valve 220 so that the RGA 224 can be operated in a high vacuum environment while still metering experimental gases through the variable leak valve. High pressure can be on the inlet side of the valve 220 and high vacuum on the other side of the valve 220 with the RGA 224 in the high vacuum environment.

The system 3000 of FIG. 3 provides for independent control of pressure and flow rate along with RGA determination of gas outlet flow characteristics. The RGA 224 is represented as located between the boom 222 and sample holder 200 to advantageously analyze gas composition near the sample holder 200 and thus to characterize reactions from the sample holder 200 and to reduce subsequent reactions or other activity of gas species drifting along the outlet line 204.

Figure 4:
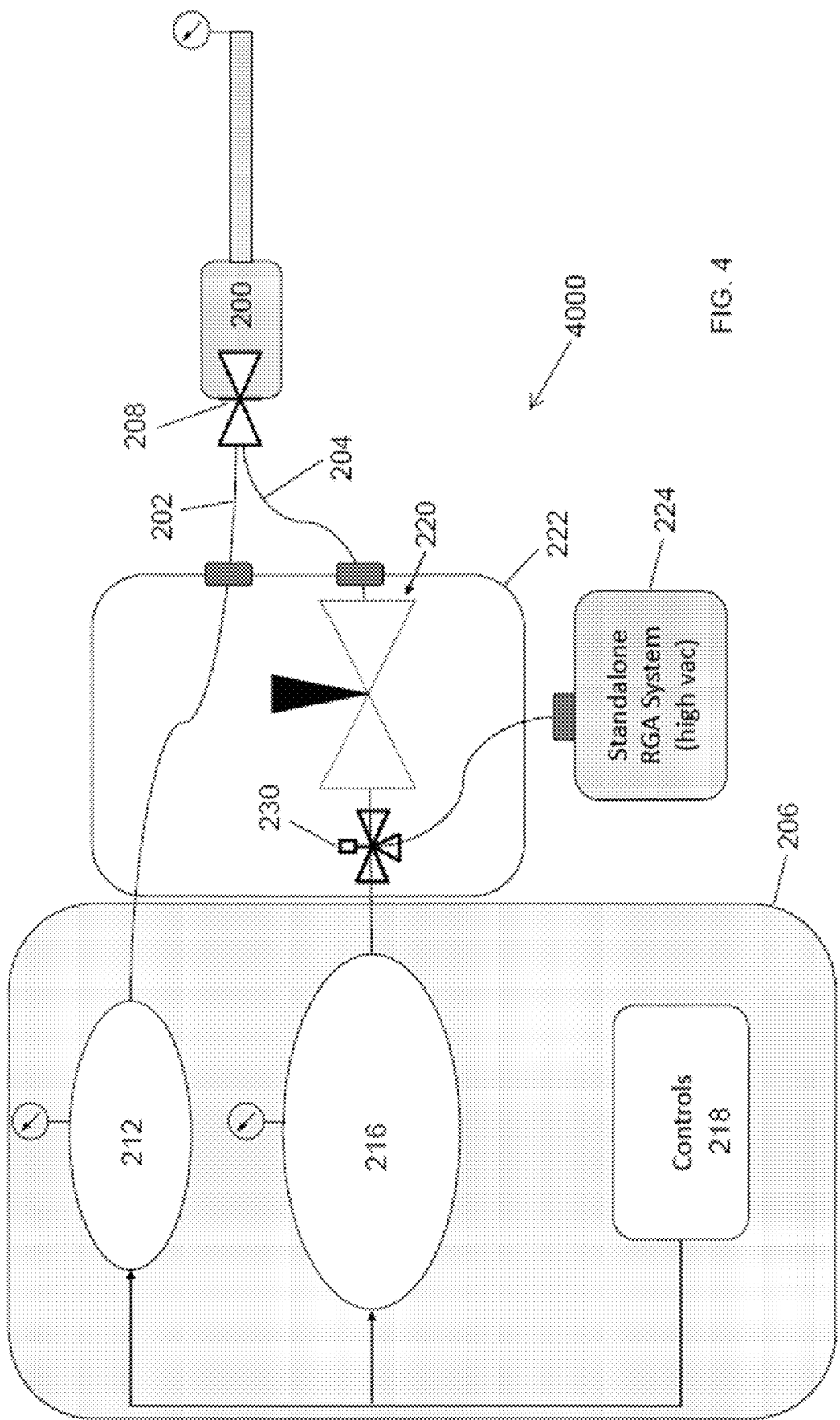
FIG. 4 is a diagrammatic representation of an improved system with valved RGA integration, according to at least one other embodiment, for controlling fluid flow and analyzing fluid compositions through an electron microscope sample holder.

FIG. 4 is a diagrammatic representation of an improved system 4000 with valved RGA integration, according to at least one other embodiment, for controlling fluid flow through the electron microscope sample holder 200. In FIG. 4, the residual gas analyzer (RGA) 224 samples gas from the outlet line 204 by way of a valve 230 at a T-junction where the valve 230 directs outlet gas to the pressure control system 206 and/or RGA 224. Flow rate is metered by the variable leak valve 220. Valve 230 can direct some or all of the gas to the RGA 224.

Figure 5:
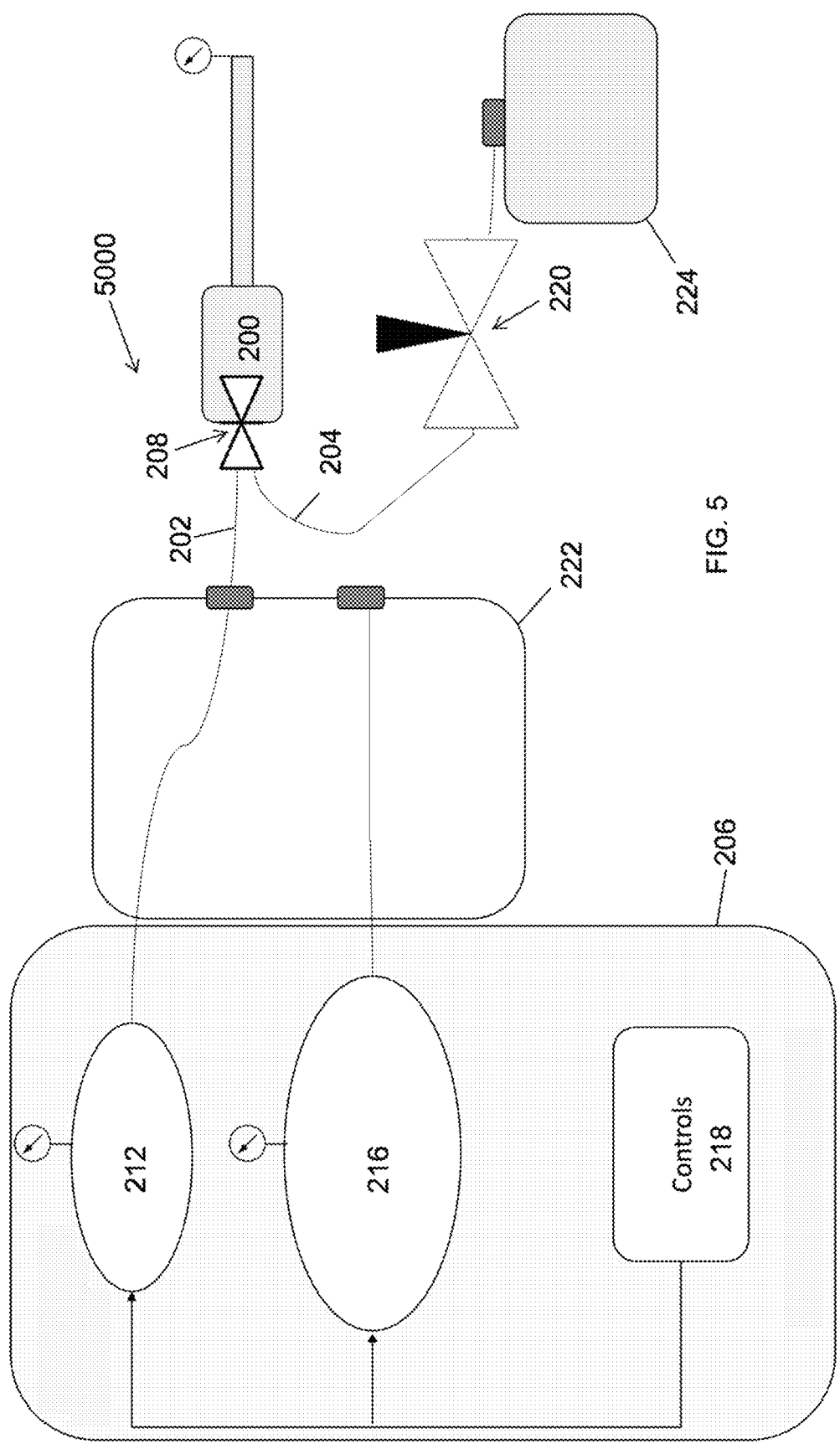
FIG. 5 is a diagrammatic representation of an improved system with direct RGA integration, according to at least one other embodiment, for controlling fluid flow through an electron microscope sample holder.

FIG. 5 is a diagrammatic representation of an improved system 5000 with direct RGA integration, according to at least one other embodiment, for controlling fluid flow through the electron microscope sample holder 200. In FIG. 5, the outlet line 204 connects directly to a variable leak valve 220 before entering a residual gas analyzer (RGA) 224. Flow rate is determined by the rate of pressure change in the upstream tank 212. In this configuration the variable leak valve 220 is not attached to the boom 222. Instead, it is mounted close to or attached to the RGA 224.

Figure 6A:
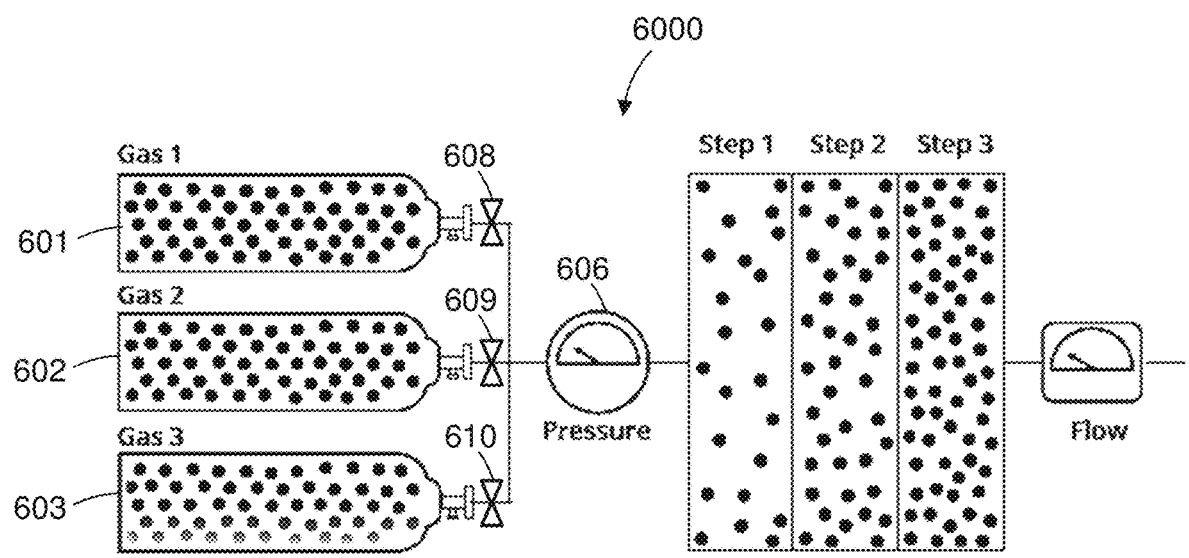
FIG. 6A is a diagrammatic representation of an improved system representing a method of adding gases to the system one at a time, according to at least one embodiment, to create precise gas mixture compositions prior to the flow of these gases through an electron microscope holder.
Figure 6B:
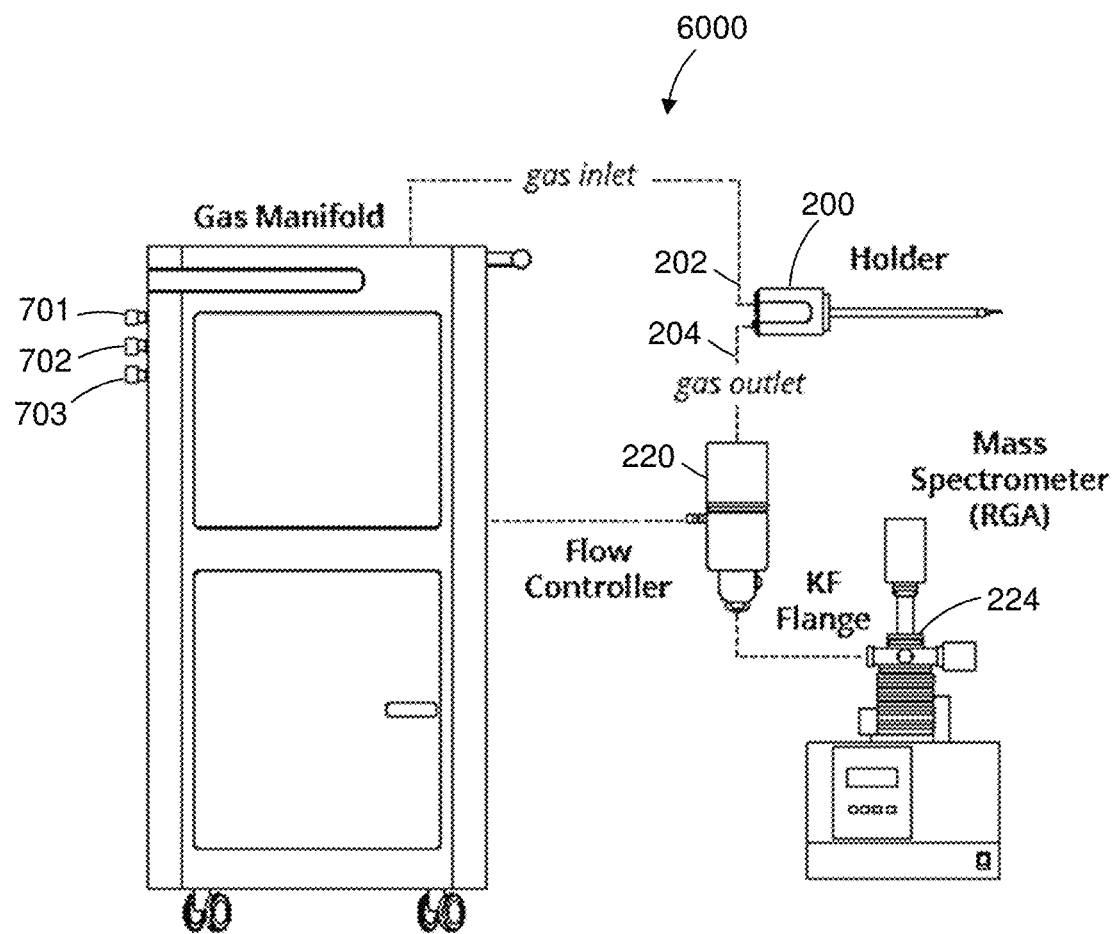
FIG. 6B is a diagrammatic representation of the improved system in FIG. 6A with a residual gas analyzer (RGA) connected to the system that can be used to verify the gas mixture composition.

FIGS. 6A and 6B are diagrammatic representations of an improved system 6000 representing a method of adding gases to the system one at a time, according to at least one embodiment, to create precise gas mixture compositions prior to the flow of these gases through an electron microscope holder 200. Pressurized vessels 601, 602 and 603, of different gases, are connected to the pressure control system 206 through ports 701, 702 and 703. Gas from the pressurized vessels 601, 602 and 603 enter the pressure control system 206 in series by opening a valve 608, 609 or 610 located between the pressurized vessels 601, 602 and 603 and the upstream tank 212. The upstream tank 212 is evacuated of gas prior to the first gas entering the upstream tank 212. A pressure gauge 606 attached to the upstream tank 212 will report rising pressures as gases flow into the upstream tank 212. The following steps are performed to create a known, precise mixture of gases in the upstream tank 212: (Step 1) A first valve, 608, 609 or 610 will open and a first gas will flow into the upstream tank 212, increasing the pressure in the upstream tank 212. When the desired pressure is reached, the first valve 608, 609 or 610 will close. (Step 2) A second valve, 608, 609 or 610 will open and a second gas will flow into the upstream tank 212, mixing with the first gas, further increasing the pressure in the upstream tank 212. When the desired pressure is reached, the second valve 608, 609 or 610 will close. (Step 3) This process may repeat in the same manner until the desired composition is achieved. The exact mixture composition can be easily calculated via firmware or software control 218 with the recorded pressures, and the volume of the upstream tank 212 as determined by Dalton's Law of Additive Pressure and the Ideal Gas Law.

Flow techniques enabled by the system 6000 allow creative use of the upstream tank 212 to blend gas mixtures without need for additional expensive and calibrated equipment. Workflows can be created to use the upstream tank 212, pressure gauge 606 and electronically driven valves to mix gases following volumetric blending. Volumetric blending is introducing partial pressures of pure gases, mixed gases, complex gases and vapors into a tank to stack the total pressure up to the target experimental pressure at the desired mixture percentages. Vapors are also possible by lowering the pressure of the supply tank below vapor pressure and then introducing liquid which will evaporate into a vapor to bring the partial pressure up to the vapor pressure at room temperature. Additional carrier gases can be added to raise the total pressure if wanted. The volumetric blend can make up the high pressure tank.

FIG. 6B is a diagrammatic representation of an improved system 6000 with direct RGA integration, according to at least one other embodiment, for verifying the gas composition by with a residual gas analyzer (RGA) 224 by flowing gas from the upstream tank 212 into the RGA 224.

Figure 7A:
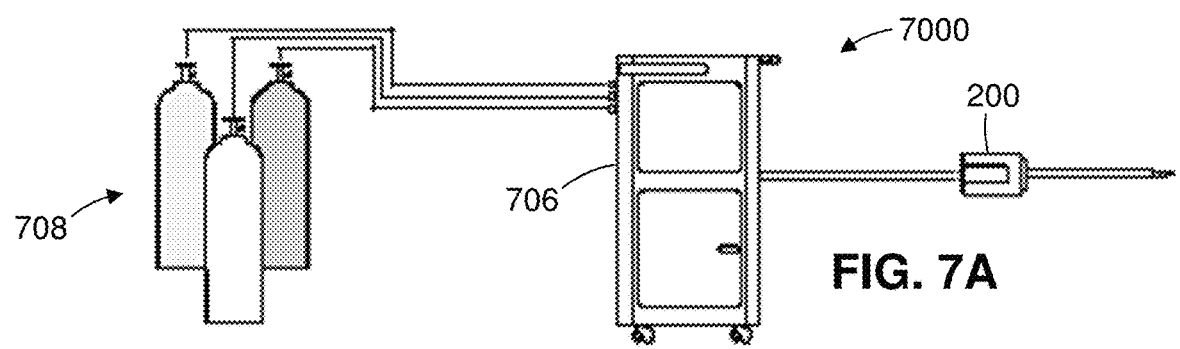
FIG. 7A is a diagrammatic representation of an improved system according to at least one embodiment, in which complex gases such as mixtures of un-verified compositions are accepted.
Figure 7B:
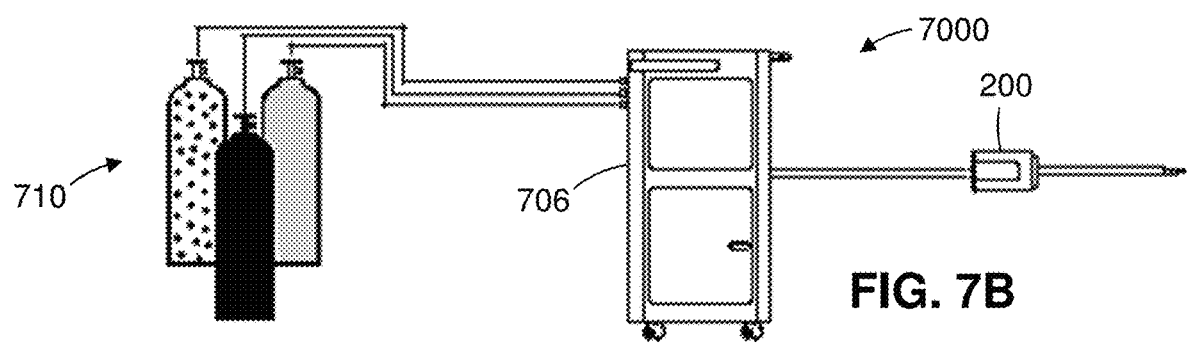
FIG. 7B is a diagrammatic representation of the improved system of FIG. 7A, in which mixtures of pre-verified composition are accepted.
Figure 7C:
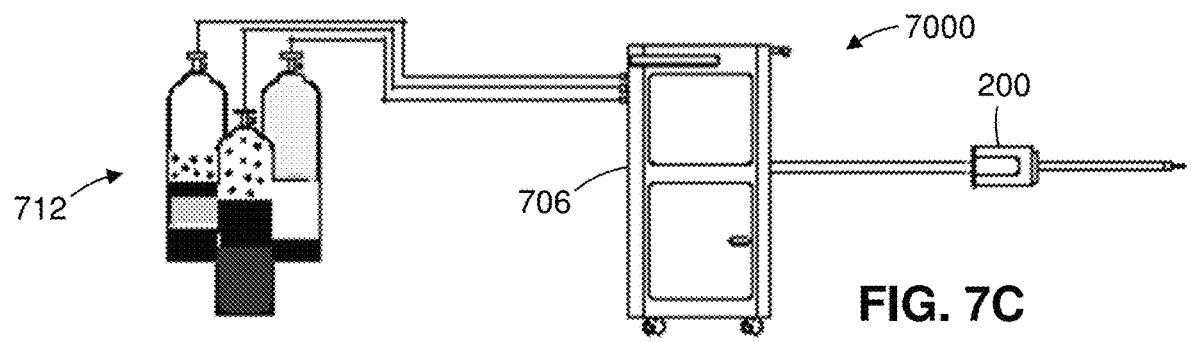
FIG. 7C is a diagrammatic representation of the improved system of FIG. 7A, in which pure gases are accepted.

FIGS. 7A, 7B and 7C are diagrammatic representations of an improved system 7000 depicting the flexibility of the system to accept supply tanks of pure gases 708, mixed gases 710 and complex gases 712 while providing an accurate adjustable volumetric flow rate through the sample holder 200. In FIG. 7C pure gases 708 are gases in their purest natural form such as H2, N2, O2, etc. In FIG. 7B mixed gases 710 are mixtures of pre-verified composition, such as 5% H2/95% N2. In FIG. 7A complex gases 712 are mixtures of un-verified compositions such as vehicle exhaust. Integrated gas manifold 706 integrates the pressure control system 206 and boom 222 as depicted in FIG. 2 or FIG. 4 enabling an accurate and wide range or flow rates and pressures through the sample holder.

Particular embodiments and features have been described with reference to the drawings. It is to be understood that these descriptions are not limited to any single embodiment or any particular set of features, and that similar embodiments and features may arise or modifications and additions may be made without departing from the scope of these descriptions and the spirit of the appended claims.

What is claimed is:

1. A system for controlling fluid flow through an electron microscope sample holder, the system comprising:
   a pressure control system that supplies source gas, the pressure control system comprising an upstream tank and a downstream low pressure source;
   an inlet line for providing the source gas from the pressure control system to the sample holder;
   an outlet line for receiving the source gas from the sample holder; and
   at least one variable leak valve connected to the outlet line and positioned downstream from the sample holder, wherein the at least one variable leak valve meters the gas flow to achieve a target gas flow rate through the sample holder based on a rate of change of pressure.

2. The system of claim 1, further comprising a residual gas analyzer (RGA) connected to the outlet line, wherein the RGA is positioned downstream of the sample holder.

3. The system of claim 2, wherein the RGA is positioned downstream of the variable leak valve.

4. The system of claim 2, wherein pressures in the upstream tank and the downstream low pressure source are measured with gas independent pressure gauges.

5. The system of claim 1, wherein a pressure in a tip of the sample holder is maintained by controlling the variable leak valve to change conduction through the sample holder as a higher pressure experimental gas is added to the source gas.

6. The system of claim 1, further comprising a boom for supporting the variable leak valve in proximity to the sample holder.

7. The system of claim 1, wherein pressures in the upstream tank and the downstream low pressure source are measured with gas independent pressure gauges.

8. The system of claim 1, wherein a largest pressure drop in the system is across the variable leak valve.

9. The system of claim 1, wherein the target gas flow rate is based on a rate of change in pressure in at least one of the upstream tank and/or the downstream low pressure source.

10. The system of claim 1, further comprising a switching valve downstream of the variable leak valve designed to direct outlet gas to the downstream low pressure source and/or a residual gas analyzer (RGA).

11. The system of claim 1, wherein the sample holder further comprises a gate valve designed to simultaneously close an inlet of the sample holder and an outlet of the sample holder.

12. The system of claim 1, further comprising a T-junction valve positioned between the at least one variable leak valve and the downstream low pressure source,
   wherein the T-junction valve is configured to direct the gas flow to the downstream low pressure source or to a spectrometer, and
   wherein the spectrometer is a residual gas analyzer (RGA), where some or all the source gas can be diverted from the variable leak valve to the RGA via the T-junction valve.

* * * * *